United States Patent
Peng et al.

(12) 
(10) Patent No.: US 6,903,022 B2
(45) Date of Patent: Jun. 7, 2005

(54) METHOD OF FORMING CONTACT HOLE

(75) Inventors: Hsin-Tang Peng, Hsinchu Hsien (TW); Yung-Ching Wang, Kaohsiung Hsien (TW); Teng-Chun Yang, Chia-Yi Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 253 days.

(21) Appl. No.: 10/262,939

(22) Filed: Oct. 3, 2002

(65) Prior Publication Data

US 2004/0067653 A1 Apr. 8, 2004

(51) Int. Cl.⁷ ............................................. H01L 21/302
(52) U.S. Cl. ...................... 438/697; 438/275; 438/279; 438/734; 438/740; 438/750
(58) Field of Search ................................ 438/243, 250, 438/275, 279, 697, 714, 734, 740, 750

(56) References Cited

U.S. PATENT DOCUMENTS

| | | | |
|---|---|---|---|
| 6,291,296 B1 | * | 9/2001 | Hui et al. ................... 438/257 |
| 6,410,422 B1 | * | 6/2002 | Sun et al. ................... 438/637 |
| 6,486,033 B1 | * | 11/2002 | Tu et al. ..................... 438/275 |
| 6,548,394 B1 | * | 4/2003 | Peng et al. ................. 438/618 |
| 2004/0147107 A1 | * | 7/2004 | Gustin et al. ............... 438/620 |

\* cited by examiner

*Primary Examiner*—George A. Goudreau
(74) *Attorney, Agent, or Firm*—Birch, Stewart, Kolasch & Birch, LLP

(57) ABSTRACT

A method of forming contact holes. A dielectric liner is comfortably formed on a substrate, parts of the dielectric liner between the second and the third conducting structure are removed, a conductive liner is conformally formed on the substrate, and parts of the metal layer are removed to leave parts thereof between the second and the third conducting structure. An ILD layer is then formed on the entire surface of the substrate, and a patterned photoresist layer is formed on the ILD layer. Finally, the ILD layer is etched using the patterned photoresist layer as a mask to form a first contact hole, a second contact hole, and a third contact hole in the ILD layer at the same time.

19 Claims, 14 Drawing Sheets

US 6,903,022 B2

METHOD OF FORMING CONTACT HOLE

BACKGROUND OF THE INVENTION

1. Field of the Invention

The present invention relates to a semiconductor process and, more particularly, to a method of forming a bitline contact hole and interconnection contact holes.

2. Description of the Related Art

When manufacturing memory products such as trench-type DRAM, stacked-type DRAM and FLASH memory, in order to reduce the size of a chip, the conventional semiconductor process uses self-aligned contact (SAC) technology to define a reduced distance between two adjacent gate conductive structures.

FIGS. 1A to 1F are sectional diagrams showing a conventional method of forming contact holes using SAC process. As shown in FIG. 1A, a P-type silicon substrate 10 is provided with plurality of shallow trench isolation (STI) regions 12 in the substrate 10 to isolate adjacent active areas (AA), a gate insulating layer 14 formed on the substrate 10, a plurality of gate conductive structures 161, 162, 163 and 164 patterned on the gate insulating layer 14, and a plurality of N⁻-type ion implantation regions 20 formed in the substrate 10 and at lateral regions of the gate conductive structures 161~164. Each of the gate conductive structures 161~164 is stacked by a polysilicon layer 17, a tungsten silicide layer 18, and a silicon nitride cap layer 19.

As shown in FIG. 1B, a silicon oxide spacer 22 is grown on the sidewalls of the polysilicon layer 17 and the tungsten silicide layer 18, and then a silicon nitride spacer 24 is formed on the sidewalls of the gate conductive structures 161~164. Next, using ion implantation with the gate conductive structures 161~164 and the silicon nitride spacer 24 as the mask, an N⁺-type ion implantation region 26 is formed in the exposed N⁻-type ion implantation region 20. Thereby, the N⁺-type ion implantation region 26 serves as a source/drain region, and the remaining N⁻-type ion implantation region 20 serves as a lightly doped drain (LDD) structure.

As shown in FIG. 1C, a SiON liner 28 is deposited on the entire surface of the substrate 10, and then an inter-layered dielectric (ILD) layer 30 with a planarized surface is formed on the SiON liner 28 to fill the gaps between adjacent gate conductive structures 161~164 by deposition and chemical mechanical polishing (CMP). Preferably, the ILD layer 30 is boro-phspho silicate glass (BPSG), high density plasma (HDP) oxide, tetraethylorthosilicate (TEOS), or their combination.

Next, as shown in FIG. 1D, using a first photoresist layer 31 with a pattern of the bitline contact hole as the mask, parts of the ILD layer 30 and the SiON liner 28 between the two gate conductive structures 162 and 163 are removed to expose the N⁺-type ion implantation region 26, thus a bitline contact hole 32 is formed.

Thereafter, as shown in FIG. 1E, after removing the first photoresist layer 31, a first conductive layer is deposited to fill the bitline contact hole 32 and then etched back to a predetermined height within the bitline contact hole 32, thus the first conductive layer remaining in the bitline contact hole 32 serves as a bitline contact plug 34.

As shown in FIG. 1F, using a second photoresist layer 35 with a pattern of interconnection contact holes as the mask, parts of the ILD layer 30, the SiON liner 28 and the silicon nitride cap layer 19 is etched to form a first interconnection contact hole 36 and a second interconnection contact hole 38. The first interconnection contact hole 36 is formed over the first gate conductive structure 161 to expose the surface of the tungsten silicide layer 18. The second interconnection contact hole 38 is formed outside the gate conductive structure 164 to expose the N⁺-type ion implantation region 26. Finally, the second photoresist layer 35 is removed.

However, the above-described SAC process has disadvantages as listed below. First, when a larger step height between AA and STI, misalignment during photolithography, or CMP cannot provide the ILD layer 30 with an appropriate thickness and superior flatness, the etched profile of the contact hole is affected, causing problems of the interconnection structure, such as a short circuit between bitline and wordline or a blind window in the bitline contact hole 32, especially for design rule shrinking more and more. Second, since the etching selectivity from the ILD layer 30 to the SiON liner 28 is not large enough to provide etching stop capability during the formation of the bitline contact hole 32, seams can form in the STI region 12 to cause junction leakage between the bitline contact plug following formed and the substrate 10. Third, the silicon nitride cap layer 19 requires thicker thickness in the SAC process, thus thermal budget is increased and electrical properties, such as $V_t$, $I_{dsat}$, $I_{off}$, are worsened. Fourth, if the SAC process is applied to manufacture a device of further reduced size, the problems encountered in photolithography and etching become more difficult. Fifth, the materials used for the cap layer 19 and the spacer 24 are limited to SiN or SiON, resulting in worsening of the leakage problem in the polysilicon layer 17.

SUMMARY OF THE INVENTION

The present invention is a method of forming contact holes to solve the above-mentioned problems.

An object of the present invention is to provide a method of forming contact holes to enhance selectivity during SAC process.

Another object of the present invention is to provide a method of forming a bitline contact hole, an interconnection contact hole to gate, and an interconnection contact hole to diffusion at the same time, to simplify process.

The method of forming contact holes is performed on a semiconductor substrate with at least four adjacent gate conductive structures, wherein a second gate conductive structure and a third gate conductive structure are formed within an active area. First, a dielectric liner is comformally formed on the substrate. Next, parts of the dielectric liner between the second conducting structure and the third conducting structure are removed. Then, a conductive liner is conformally formed on the substrate. Parts of the metal layer are removed to leave parts of the metal layer between the second conducting structure and the third conducting structure. An inter-layered dielectric (ILD) layer is then formed on the entire surface of the substrate to cover the conductive liner and fill the gap between the first gate conductive structure and the second gate conductive structure, the gap between the second gate conductive structure and the third gate conductive structure, and the gap between the third gate conductive structure and the fourth gate conductive structure. A patterned photoresist layer is formed on the ILD layer. Finally, the ILD layer is etched using the patterned photoresist layer as a mask to form a first contact hole, a second contact hole and a third contact hole in the ILD layer at the same time, wherein the first contact hole exposes the top of the first gate conductive structure, the second contact hole exposes the conductive liner, and the third contact hole exposes the substrate outside the fourth gate conductive structure.

According to the present invention, the conductive liner comprises polysilicon or TiN.

According to the present invention, removal of parts of the dielectric liner comprises the following steps. First, a first patterned photoresist layer is formed on the dielectric liner to expose the surface of the lining layer between the second gate conductive structure and the third gate conductive structure. Then, the dielectric liner is etched using the first patterned photoresist layer as a mask. Finally, the first patterned photoresist layer is removed.

According to the present invention, removal of parts of the conductive liner comprises the following steps. First, a second patterned photoresist layer is formed on parts of the conductive liner between the second gate conductive structure and the third gate conductive structure. Next, the conductive liner is etched using the second patterned photoresist layer as a mask. Finally, the second patterned photoresist layer is removed.

According to the present invention, the formation of the conductive liner comprises the following steps. First, the conductive liner is comformally formed on the entire surface of the substrate. Thereafter, parts of the conductive liner are removed to leave parts of the conductive liner between the second conductive structure and the third conductive structure.

In a preferred embodiment of the present invention, the dielectric liner comprises: $SiO_xN_y$, SiN, or $SiO_2$. Each of the gate conductive structures comprises a gate electrode layer and a cap layer. The substrate comprises a first shallow trench isolation (STI) region between the first gate conductive structure and the second gate conductive structure, and a second STI region between the third gate conductive structure and the fourth gate conductive structure, wherein the first STI region and the second STI region define the active area.

BRIEF DESCRIPTION OF THE DRAWINGS

The above and other objects, features, and advantages of the present invention will become apparent from the following detailed description of preferred embodiments of the invention explained with reference to the accompanying drawings, in which.

DETAILED DESCRIPTION OF THE INVENTION

FIGS. 2A to 2H are sectional diagrams showing a method of forming contact holes according to the present invention.

Figure 1A:
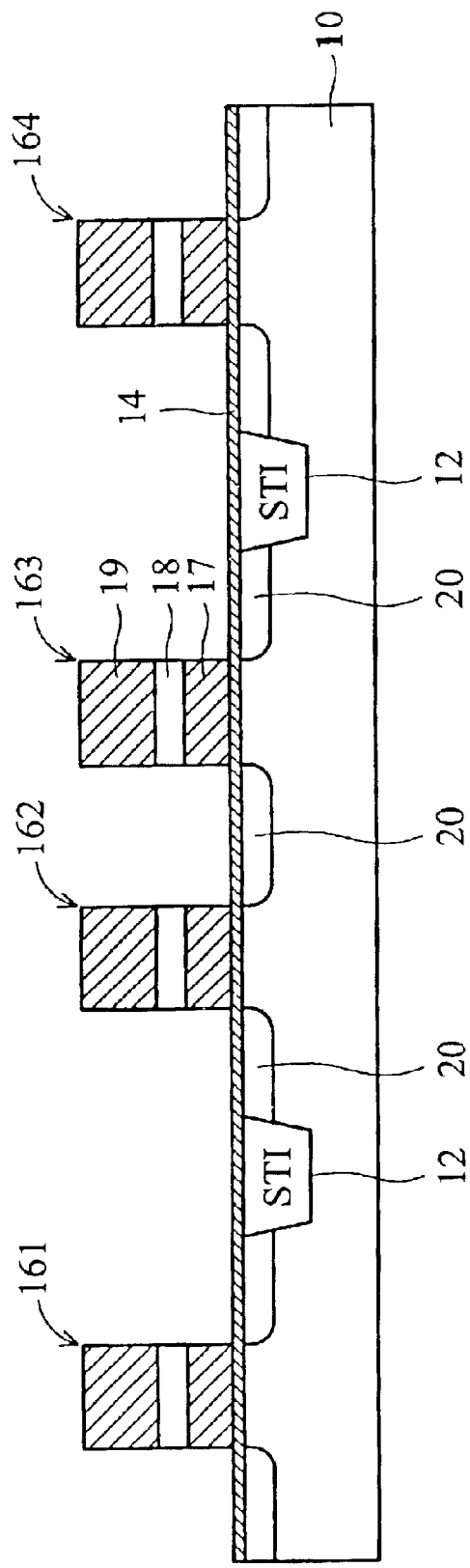
FIGS. 1A to 1F are sectional diagrams showing a conventional method of forming contact holes using SAC process.
Figure 1B:
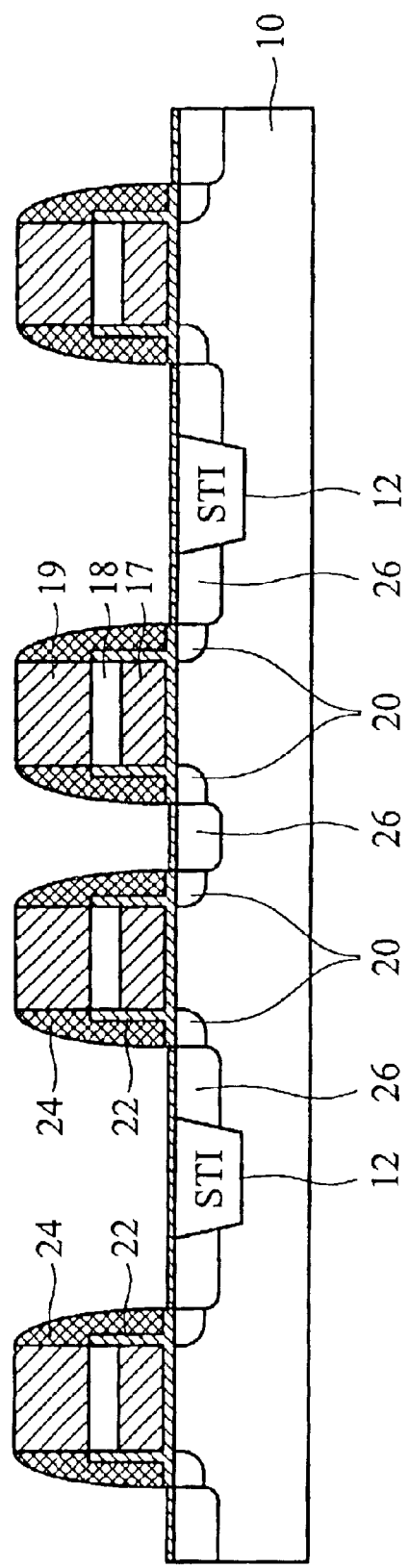
Figure 1C:
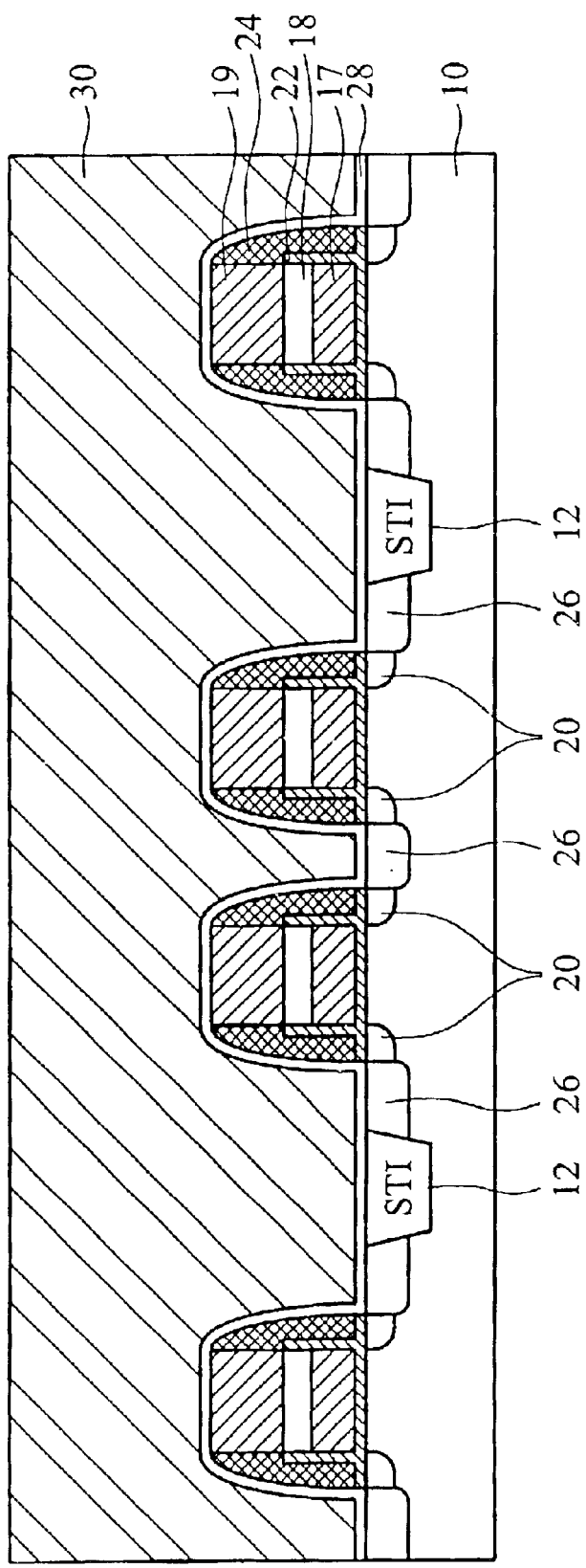
Figure 1D:
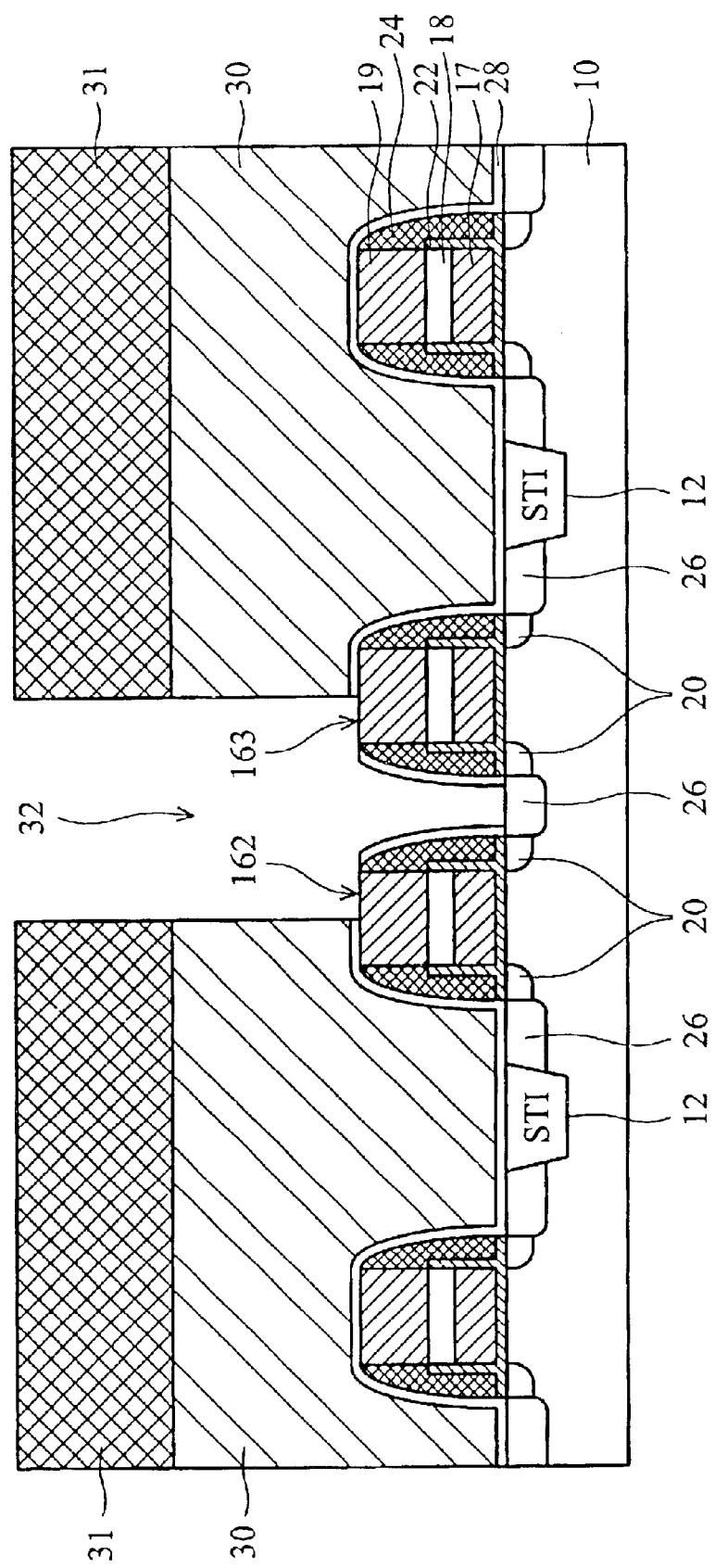
Figure 1E:
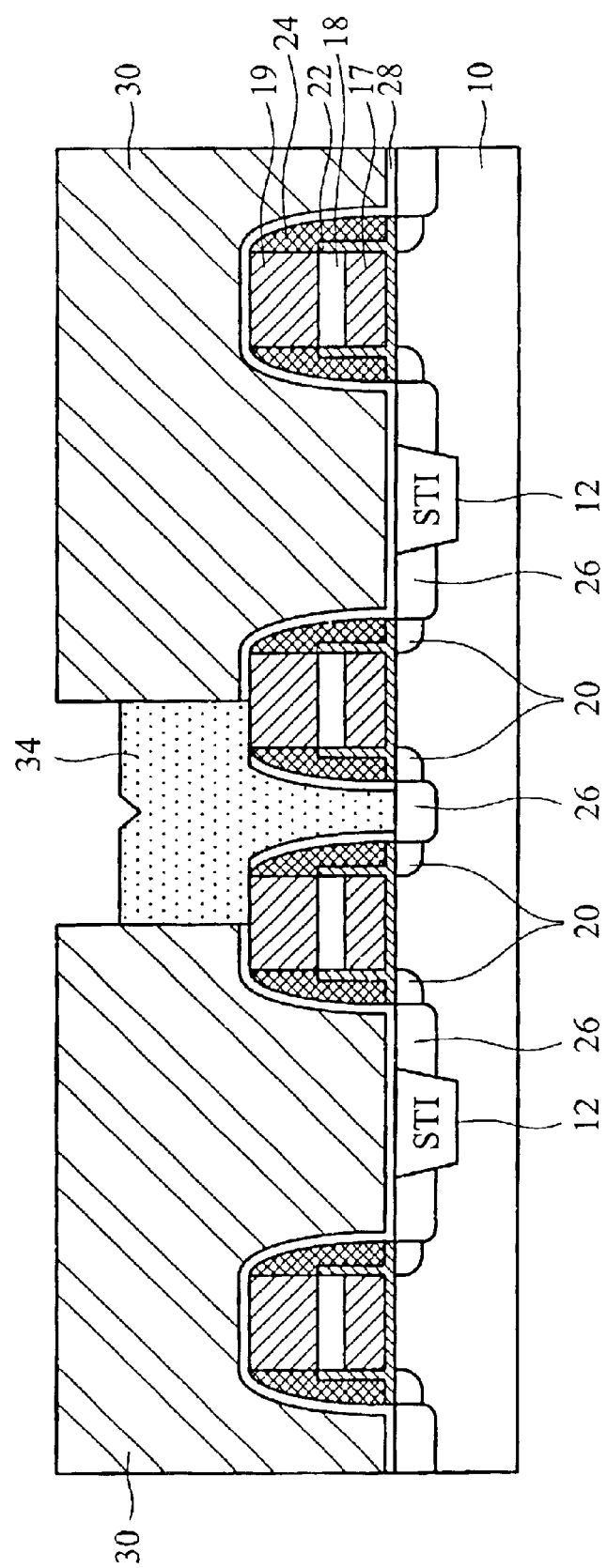
Figure 1F:
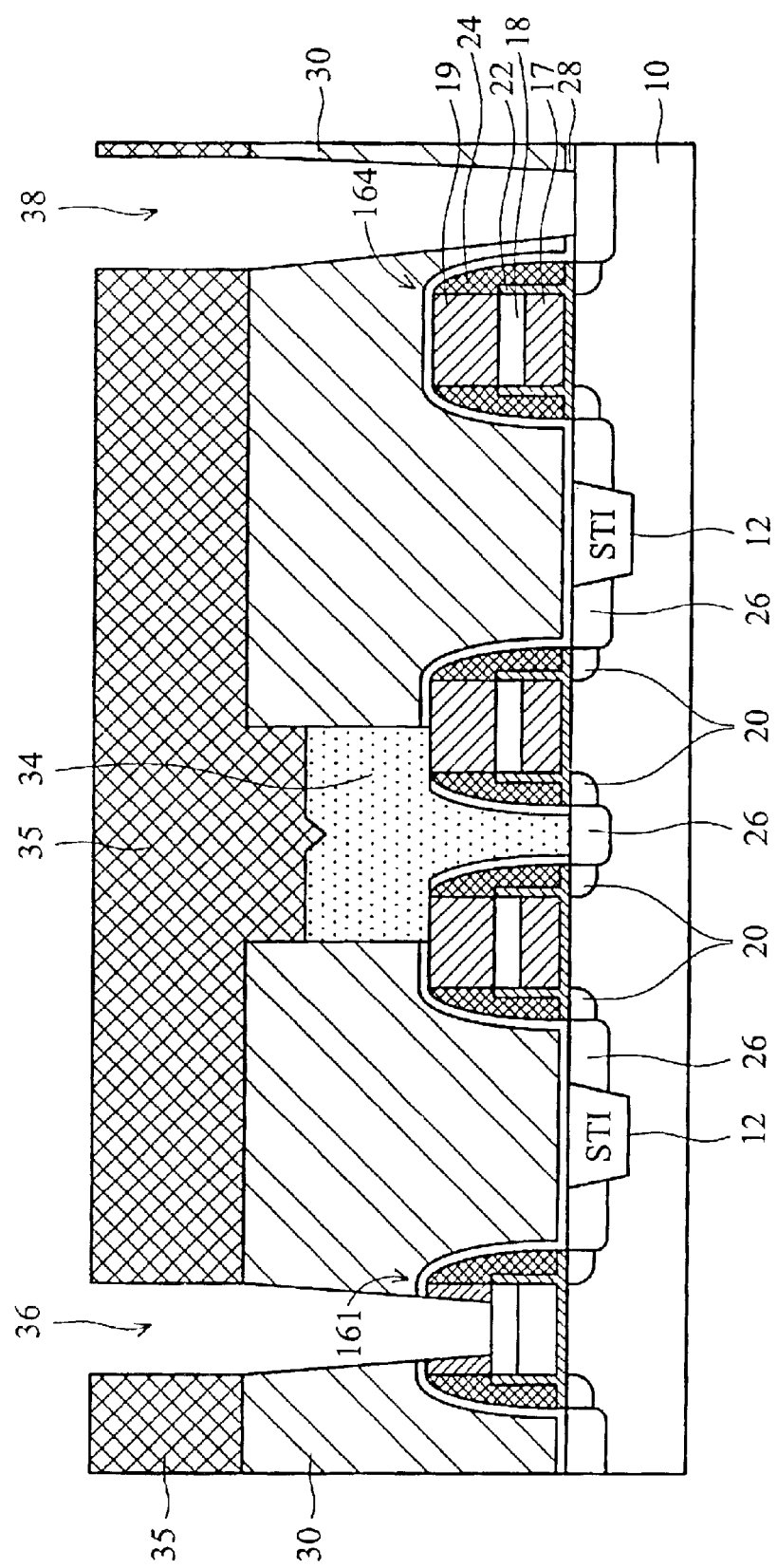
Figure 2A:
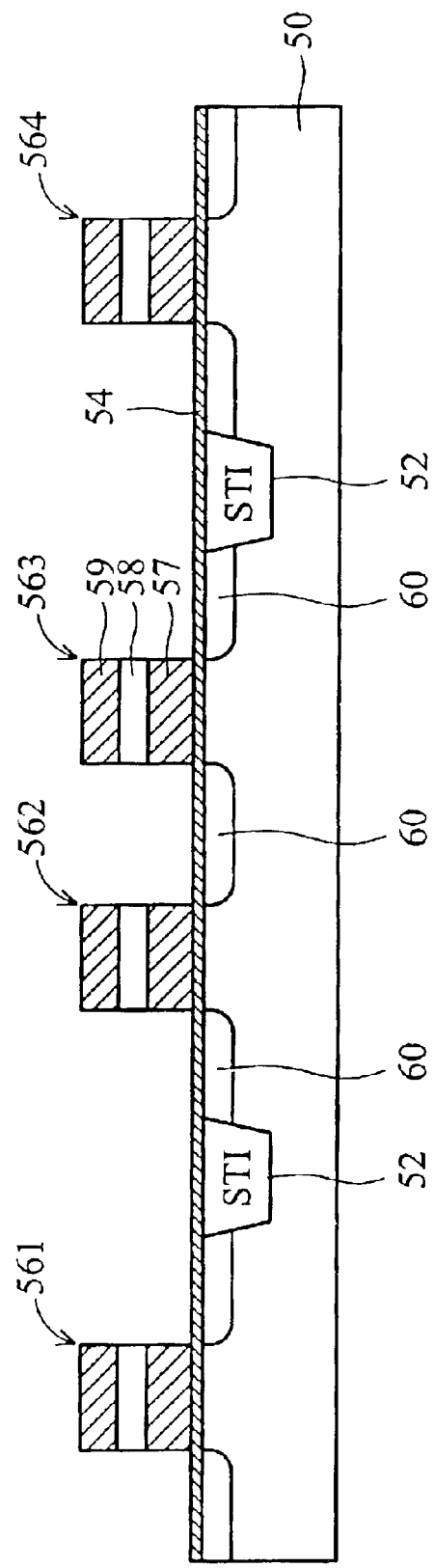
FIGS. 2A to 2H are sectional diagrams illustrating a method of forming contact holes according to the present invention.

As shown in FIG. 2A, a P-type silicon substrate 50 is provided with a plurality of STI regions 52 to isolate active areas, a gate insulating layer 54 formed on the substrate 50, a plurality of gate conductive structures 561, 562, 563 and 564 patterned on the gate insulating layer 54, and a plurality of N$^-$-type ion implantation regions 60 formed in the substrate 50 and at lateral regions of the gate conductive structures 561~564. Each of the gate conductive structures 561~564 is stacked by a polysilicon layer 57, a tungsten silicide layer 58 and a cap layer 59. Preferably, the material used to formed cap layer 59 is selected from SiN, SiON or silicon oxide.

Figure 2B:
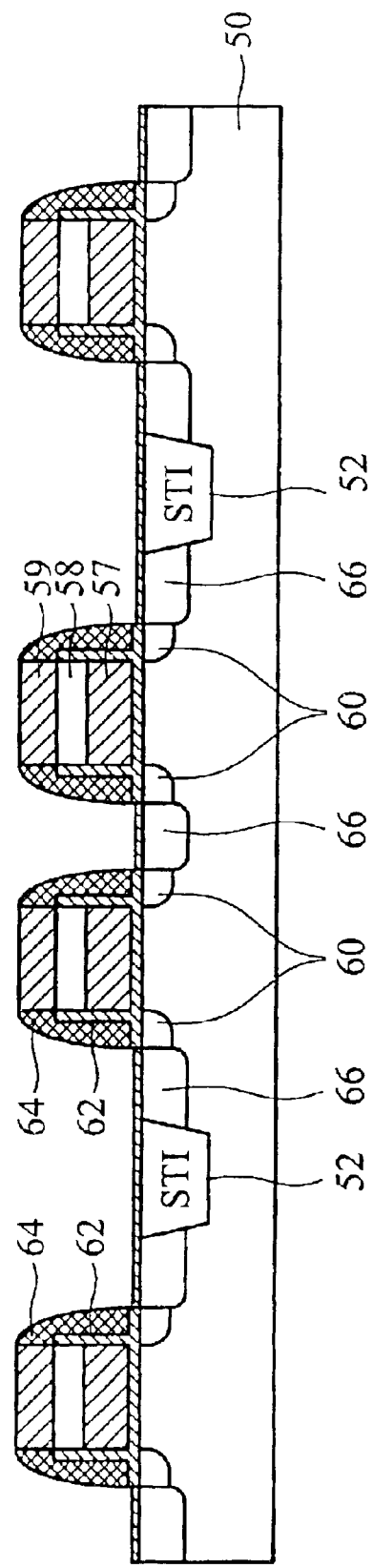

As shown in FIG. 2B, a first spacer 62 is formed on the exposed sidewalls of the polysilicon layer 57 and the tungsten silicide layer 58, and then a second spacer 64 is formed on the exposed sidewalls of the gate conductive structures 561~564. Preferably, the first spacer 62 is silicon oxide, and the second spacer 64 is selected from SiN, SiON or silicon oxide. Next, using the gate conductive structures 561~564 and the second spacer 64 as the mask, N$^+$-type ion implantation regions 66 are respectively formed in the exposed N$^-$-type ion implantation regions 60. Therefore, the N$^+$-type ion implantation region 66 serves as a source/drain region, and the N$^-$-type ion implantation region 60 serves as a lightly doped drain (LDD) structure.

Figure 2C:
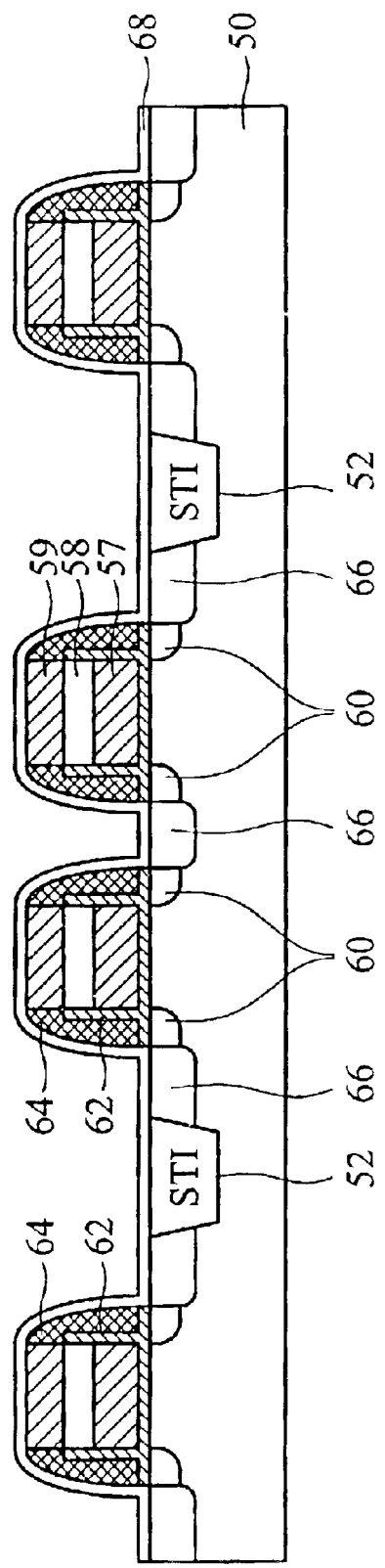

As shown in FIG. 2C, a dielectric liner 68 is preferably deposited on the entire surface of the substrate 50, and the material of the dielectric liner 68 comprises SiON, SiN or silicon oxide.

Figure 2D:
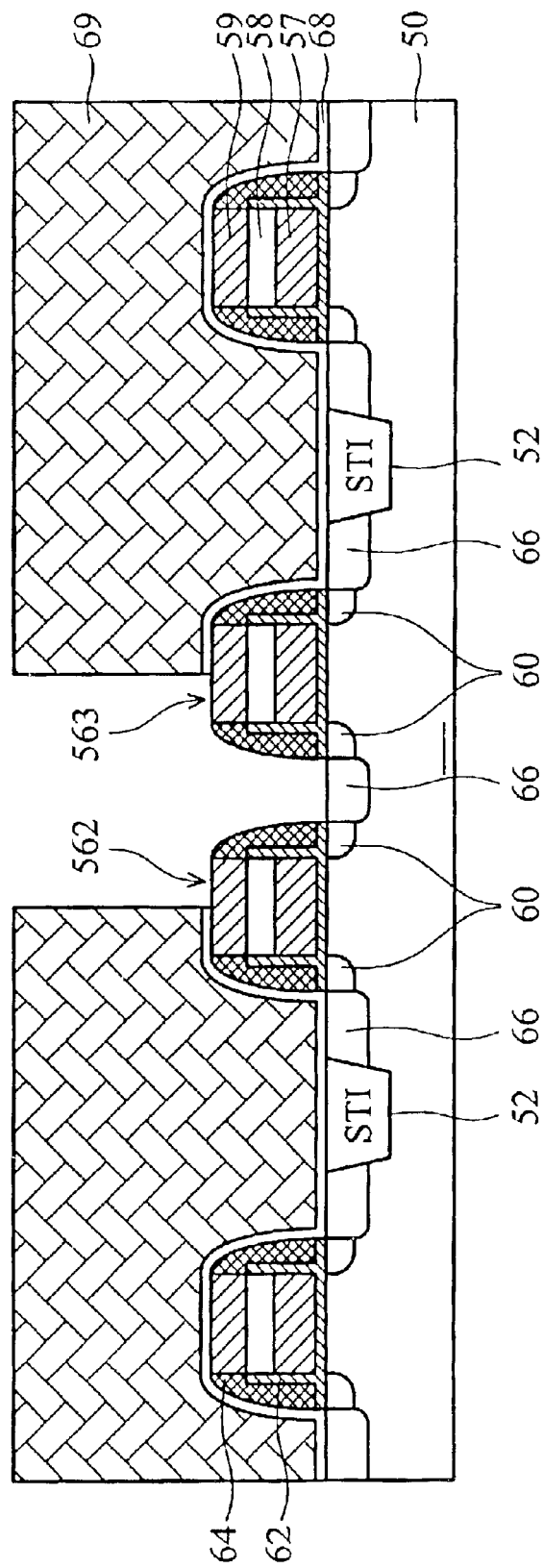

Then, as shown in FIG. 2D, using photolithography and etching with a first photoresist layer 69 as the mask, parts of the dielectric liner 68 deposited between the second gate conductive structure 562 and the third gate conductive structure 563 are removed to expose the surface of the N$^+$-type ion implantation region 66.

Figure 2E:
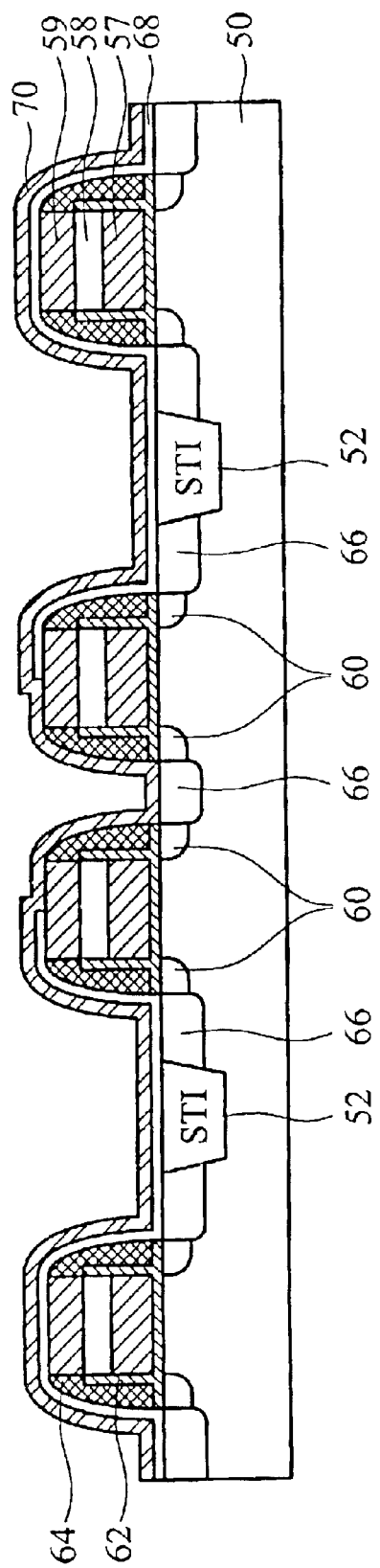

Next, as shown in FIG. 2E, after removing the first photoresist layer 69, a conductive liner 70 is formed conformally on the entire surface of the substrate 50. The material used to form the conductive liner 70 comprises polysilicon or TiN.

Figure 2F:
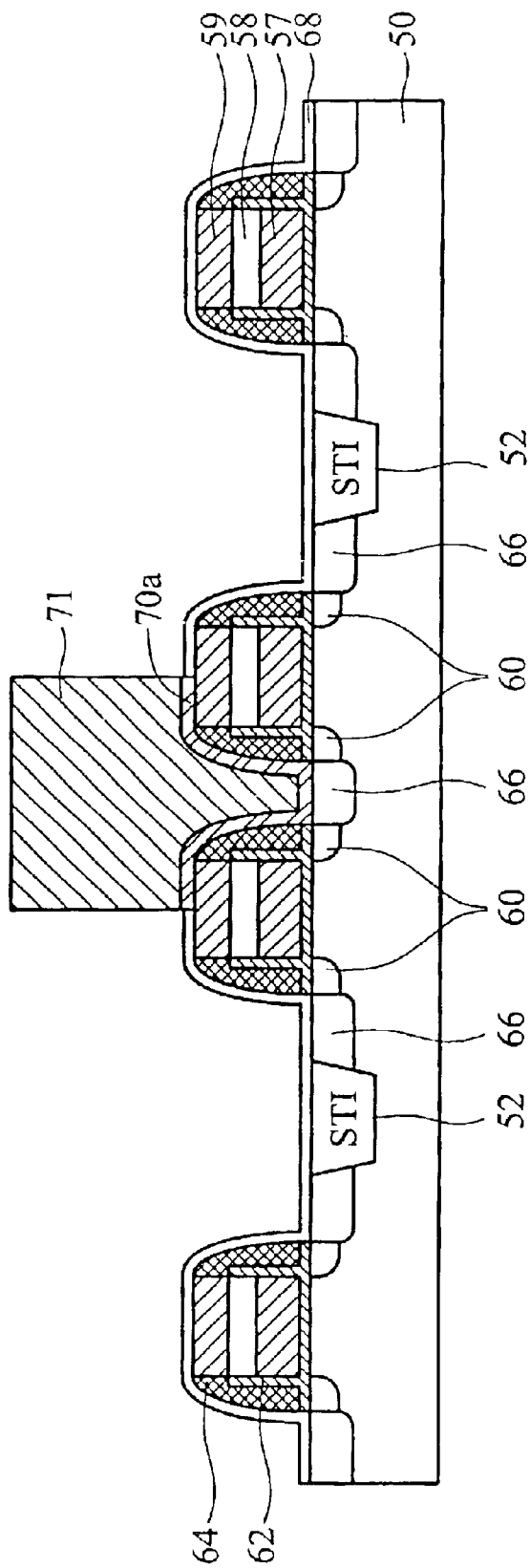

Thereafter, as shown in FIG. 2F, using a second photoresist layer 71 as the mask and using the dielectric liner 68 as the etching stop layer, most of the conductive liner 70 is removed, thus the conductive liner 70 only remains in the gap between the second gate conductive structure 562 and the third gate conductive structure 563. The second photoresist layer 71 can be the reverse tone of the first photoresist layer 69.

Figure 2G:
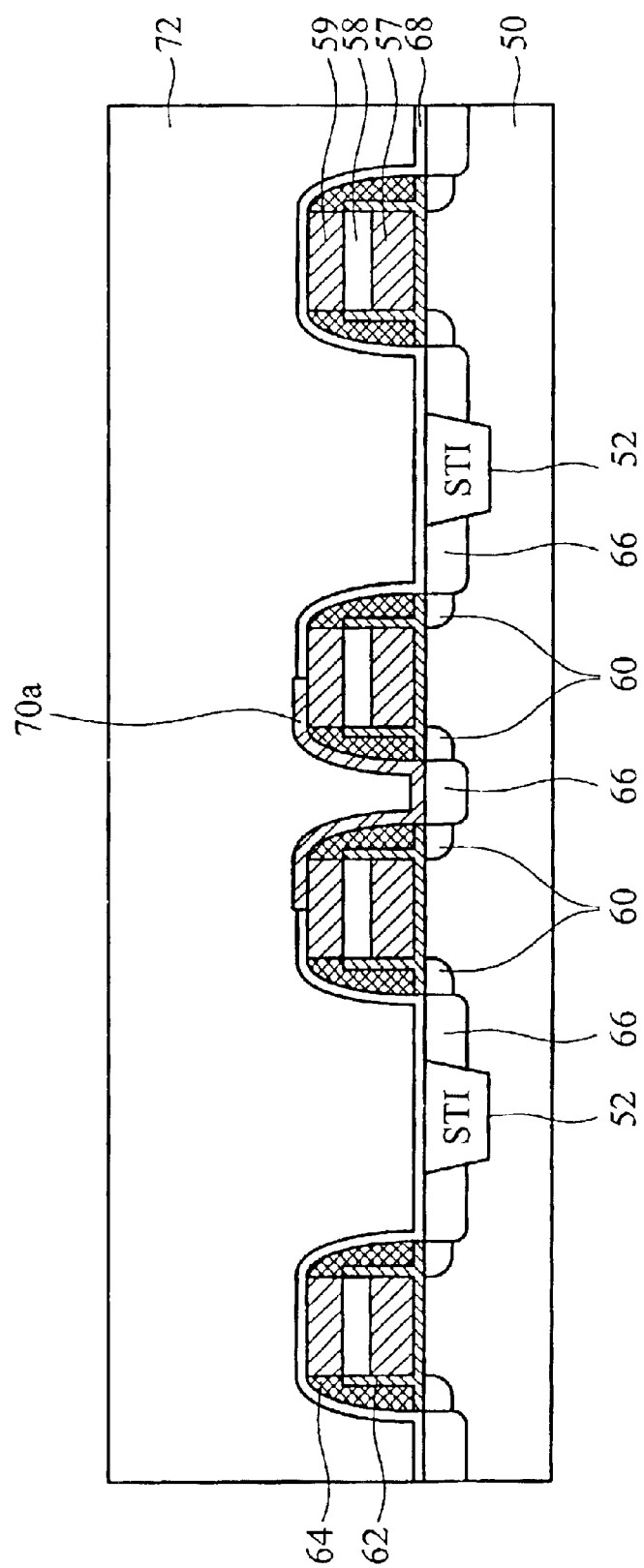

As shown in FIG. 2G, after removing the second photoresist layer 71, an ILD layer 72 with a planarized surface is formed on the entire surface of the substrate 50 to fill the gaps between adjacent gate conductive structures 561~564 by deposition and CMP. The material of the ILD layer 72 comprises BPSG, HDP oxide, TEOS oxide or a combination thereof.

Figure 2H:
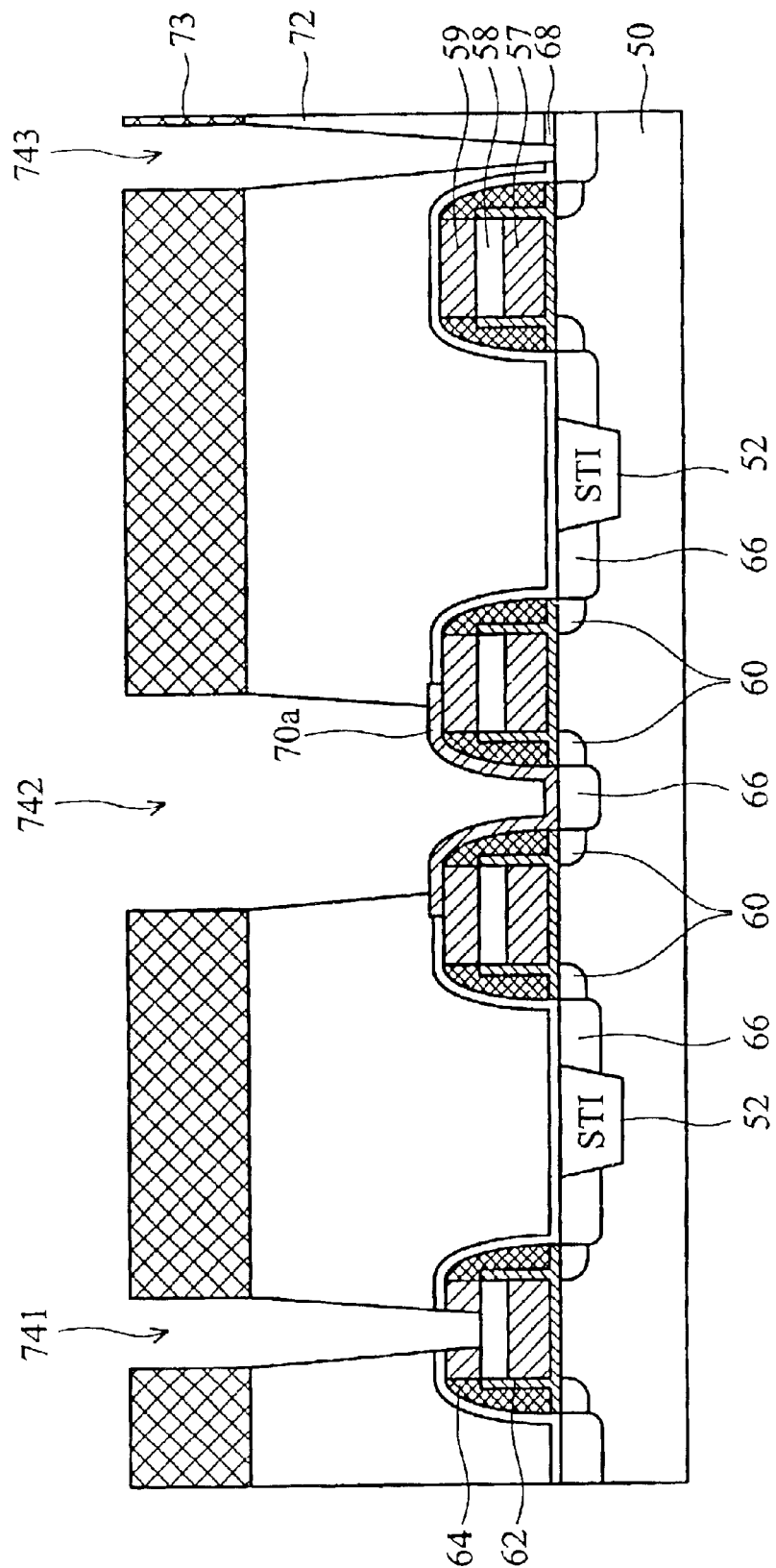

Finally, as shown in FIG. 2H, using a third photoresist layer 73 with a pattern of contact holes as the mask, parts of the ILD layer 72, the dielectric liner 68 and the cap layer 59 is removed to form a first interconnection contact hole 741, a bitline contact hole 742 and a second interconnection contact hole 743. The bitline contact hole 742 formed using the conductive liner 70a as an etching stop layer exposes the conductive liner 70a between the second gate conductive structure 562 and the third gate conductive structure 563. The first interconnection contact hole 741 is over the first gate conductive structure 561 to expose the surface of the tungsten silicide layer 58. The second interconnection contact hole 743 is outside the fourth gate conductive structure 564 to expose the N$^+$-type ion implantation region 66.

Compared with the prior art of forming the bitline contact hole, the present invention has advantages as listed below. First, since the etching selectivity from polysilicon to silicon oxide is very high, the formation of the bitline contact hole 742 over the conductive liner 70a avoids the problems of poor etching profile, short circuits in the interconnection structure and blind window caused by conventional SAC process. Second, the first photoresist layer 69 is used as the mask to remove the dielectric liner 68 between the second gate conducting layer 562 and the third conducting layer 563, thus the recess depth of the exposed silicon is not overly large, preventing the formation of seams in the active area and STI region 52. This will prevent junction leakage between the substrate 50 and formation of a contact plug. Third, a good ohmic contact is formed between the conductive liner 70a and the substrate 50 to provide a stable contact resistance. Fourth, a thinner cap layer 59 is employed to reduce thermal budget and promote electrical qualities of the product. Fifth, the present invention can be applied to manufacture a device of further reduced size without encountering problems in photolithography. Sixth, the materials used for the cap layer 59 and the second spacer 64 are not only SiN and SiON, but also silicon oxide. This increases flexibility in choosing materials to form the cap layer 59 and the second spacer 64. Seventh, the alignment of the gate and the contacts can be controlled precisely when the dielectric liner 68 is silicon nitride, the ILD layer 72 is BPSG. In another preferred embodiment, when the dielectric liner 68 is silicon oxide, the material used to form the ILD layer 72 is selected from dielectric materials not containing boron and phosphorous. This prevents the boron ions or phosphorous ions from diffusing into the substrate 50 so as to ensure the device stability.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming a contact hole, comprising steps of:
   providing a semiconductor substrate having a first gate conductive structure, a second gate conductive structure, a third gate conductive structure and a fourth gate conductive structure in sequence, wherein the second gate conductive structure and the third gate conductive structure are formed within an active area;
   forming a conductive liner conformally on the substrate between the second gate conductive structure and the third gate conductive structure;
   forming an inter-layered dielectric (ILD) layer on the entire surface of the substrate to cover the conductive liner and fill the gap between the first gate conductive structure and the second gate conductive structure, the gap between the second gate conductive structure and the third gate conductive structure, and the gap between the third gate conductive structure and the fourth gate conductive structure; and
   forming a bitline contact hole in the ILD layer to expose the conductive liner.

2. The method as claimed in claim 1, wherein the conductive liner comprises polysilicon or TiN.

3. The method as claimed in claim 1, wherein the formation of the conductive liner comprises steps of:
   forming the conductive liner conformally on the entire surface of the substrate; and
   removing parts of the conductive liner to leave parts of the conductive liner between the second conductive structure and the third conductive structure.

4. The method as claimed in claim 1, wherein the step of forming the bitline contact hole further comprises forming a first interconnection contact hole and a second interconnection contact hole in the ILD layer at the same time, wherein the first interconnection contact hole exposes the top of the first gate conductive structure and the second interconnection contact hole exposes the substrate outside the fourth gate conductive structure.

5. The method as claimed in claim 1, wherein each of the gate conductive structures comprises a gate electrode layer and a cap layer.

6. The method as claimed in claim 1, wherein the substrate comprises a first shallow trench isolation (STI) region between the first gate conductive structure and the second gate conductive structure, and a second STI region between the third gate conductive structure and the fourth gate conductive structure, wherein the first STI region and the second STI region define the active area.

7. A method of forming contact holes, comprising steps of:
   providing a semiconductor substrate having a first gate conductive structure, a second gate conductive structure, a third gate conductive structure and a fourth gate conductive structure in sequence, wherein the second gate conductive structure and the third gate conductive structure are formed within an active area;
   forming a conductive liner conformally on the substrate between the second gate conductive structure and the third gate conductive structure;
   forming an inter-layered dielectric (ILD) layer on the entire surface of the substrate to cover the conductive liner and fill the gap between the first gate conductive structure and the second gate conductive structure, the gap between the second gate conductive structure and the third gate conductive structure, and the gap between the third gate conductive structure and the fourth gate conductive structure;
   forming a patterned photoresist layer on the ILD layer; and
   etching the ILD layer using the patterned photoresist layer as a mask to form a first contact hole, a second contact hole and a third contact hole in the ILD layer at the same time, wherein the first contact hole exposes the top of the first gate conductive structure, the second contact hole exposes the conductive liner, and the third contact hole exposes the substrate outside the fourth gate conductive structure.

8. The method as claimed in claim 7, wherein the conductive liner comprises polysilicon or TiN.

9. The method as claimed in claim 7, wherein the formation of the conductive liner comprises steps of:
   forming the conductive liner conformally on the entire surface of the substrate; and
   removing parts of the conductive liner to leave parts of the conductive liner between the second conductive structure and the third conductive structure.

10. The method as claimed in claim 7, wherein each of the gate conductive structures comprises a gate electrode layer and a cap layer.

11. The method as claimed in claim 7, wherein the substrate comprises a first shallow trench isolation (STI) region between the first gate conductive structure and the second gate conductive structure, and a second STI region between the third gate conductive structure and the fourth gate conductive structure, wherein the first STI region and the second STI region define the active area.

12. A method of forming contact holes, comprising steps of:
- providing a semiconductor substrate having a first gate conductive structure, a second gate conductive structure, a third gate conductive structure and a fourth gate conductive structure in sequence, wherein the second gate conductive structure and the third gate conductive structure are formed within an active area;
- forming a dielectric liner conformally on the substrate;
- removing parts of the dielectric liner between the second conducting structure and the third conducting structure;
- forming a conductive liner conformally on the substrate;
- removing parts of the metal layer to leave parts of the metal layer between the second conducting structure and the third conducting structure;
- forming an inter-layered dielectric (ILD) layer on the entire surface of the substrate to cover the conductive liner and fill the gap between the first gate conductive structure and the second gate conductive structure, the gap between the second gate conductive structure and the third gate conductive structure, and the gap between the third gate conductive structure and the fourth gate conductive structure; forming a patterned photoresist layer on the ILD layer; and
- etching the ILD layer using the patterned photoresist layer as a mask to form a first contact hole, a second contact hole and a third contact hole in the ILD layer at the same time, wherein the first contact hole exposes the top of the first gate conductive structure, the second contact hole exposes the conductive liner, and the third contact hole exposes the substrate outside the fourth gate conductive structure.

13. The method as claimed in claim 12, wherein the conductive liner comprises polysilicon or TiN.

14. The method as claimed in claim 12, wherein the step of removing parts of the dielectric liner comprises:
- forming a first patterned photoresist layer on the dielectric liner to expose the surface of the dielectric liner between the second gate conductive structure and the third gate conductive structure;
- etching the dielectric liner using the first patterned photoresist layer as a mask; and
- removing the first patterned photoresist layer.

15. The method as claimed in claim 12, wherein the dielectric liner comprises: $SiO_xN_y$, SiN, or $SiO_2$.

16. The method as claimed in claim 12, wherein the step of removing parts of the conductive liner comprises:
- forming a second patterned photoresist layer on parts of the conductive liner between the second gate conductive structure and the third gate conductive structure;
- etching the conductive liner using the second patterned photoresist layer as a mask; and
- removing the second patterned photoresist layer.

17. The method as claimed in claim 12, wherein the formation of the conductive liner comprises steps of:
- forming the conductive liner conformally on the entire surface of the substrate; and
- removing parts of the conductive liner to leave parts of the conductive liner between the second conductive structure and the third conductive structure.

18. The method as claimed in claim 12, wherein each of the gate conductive structures comprises a gate electrode layer and a cap layer.

19. The method as claimed in claim 12, wherein the substrate comprises a first shallow trench isolation (STI) region between the first gate conductive structure and the second gate conductive structure, and a second STI region between the third gate conductive structure and the fourth gate conductive structure, wherein the first STI region and the second STI region define the active area.

* * * * *